INVENTOR.
David S. Jacobson
BY
Glenn H Bruestle
ATTORNEY

United States Patent

[11] 3,602,780

[72] Inventor David Stanley Jacobson
Plainfield, N.J.
[21] Appl. No. 13,120
[22] Filed Feb. 20, 1970
[45] Patented Aug. 31, 1971
[73] Assignee RCA Corporation

[54] RADIAL HIGH FREQUENCY POWER TRANSISTOR EMPLOYING PERIPHERAL EMITTER CONTACT RING AND HIGH CURRENT BASE CONTACT LAYER
1 Claim, 4 Drawing Figs.

[52] U.S. Cl. .......... 317/235 R, 317/234 R, 317/234 N, 317/235 Q, 317/235 Z, 317/234 Q
[51] Int. Cl. .......... H01l 5/00
[50] Field of Search .......... 317/234, 235

[56] References Cited
UNITED STATES PATENTS
3,453,503 7/1969 Schulz et al. .......... 317/235
3,368,123 2/1968 Rittmann .......... 317/235

*Primary Examiner*—John W. Huckert
*Assistant Examiner*—B. Estrin
*Attorney*—Glenn H. Bruestle

ABSTRACT: A transistor which includes a collector region having a hub extending to the surface, and an annular base region disposed adjacent to the collector and about the hub, with portions of the base extending to the surface and forming a plurality of radial lobes around the hub. An emitter region is disposed in the base, and comprises a ring about the ends of the base lobes, and wedge-shaped portions between adjacent base lobes.

In an alternate embodiment, the annular emitter ring is omitted.

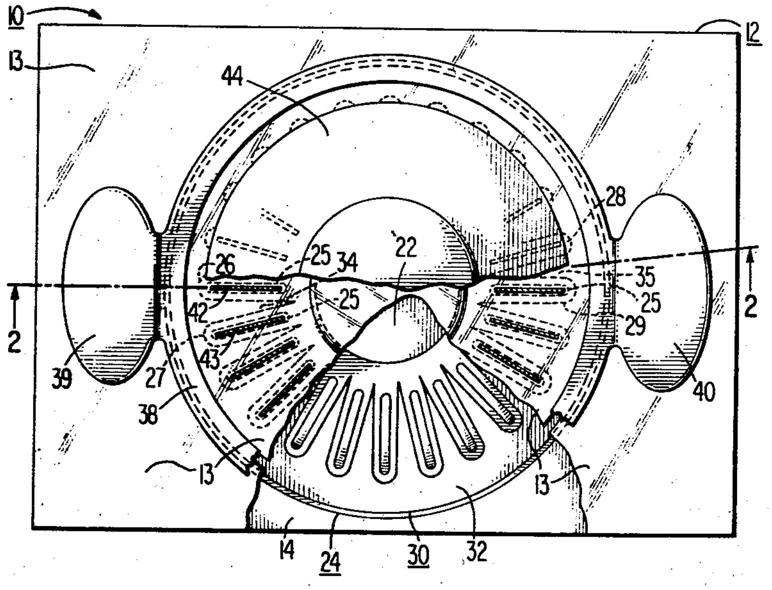

INVENTOR.
David S. Jacobson
BY
Glenn H. Bruestle
ATTORNEY

RADIAL HIGH FREQUENCY POWER TRANSISTOR EMPLOYING PERIPHERAL EMITTER CONTACT RING AND HIGH CURRENT BASE CONTACT LAYER

BACKGROUND OF THE INVENTION

The present invention relates to semiconductor devices, and relates, in particular, to transistors having device geometries and contact structures designed to improve current handling and frequency characteristics for high-power, high-frequency operation.

Several transistor geometries and contact structures have been developed in an attempt to increase the numerical ratio between emitter periphery and base area, the emitter current injection uniformity, and other figures of merit. Notable among these developments is the "overlay" transistor. This device is described in U.S. Pat. No. 3,434,019, which is assigned to the assignee of the present invention. The "overlay" device employs a rectangular grid of separate emitter sites, interconnected by an emitter metal contact structure which overlies an oxide coating and portions of the base. Current injection uniformity is maintained by a high conductivity base zone between each base contact and the base regions.

Another device employs a base region which "perforates" the emitter region, giving the emitter profile a rectangular mesh, or lattice appearance. While this device is not capable of operating at the same power and frequency levels as the "overlay" transistor, it does not employ the high conductivity base zone, and is therefore cheaper to manufacture. An example of this device is disclosed in U.S. Pat. No. 3,444,443. Another "mesh emitter" transistor is described in U.S. Pat. No. 3,453,503. This transistor includes a mesh emitter geometry in which the separate emitter regions extend from the sides of the wafer toward the center of the device.

The manner in which ohmic contact is made to the semiconductor regions of the device is also another major consideration in the design of RF power transistors. In prior art "mesh emitter" devices, contact is generally made to the base region by means of a plurality of narrow base contact fingers extending over the oxide coating, and portions of the emitter mesh. Emitter contact is made by narrow metal fingers extending along parallel portions of the emitter mesh, and between adjacent base contact fingers. Examples of this contact structure are employed in the mesh emitter devices described above. However, narrow metal contacts such as those described, exhibit undesirable parasitic reactances, and are not capable of carrying high current densities.

Furthermore, in a high-frequency power transistor, the base contact resistance constitutes a major portion of the extrinsic base spreading resistance $R_{bb}'$; it is therefore necessary to minimize base contact resistance to obtain maximum power gain. Low contact resistance is inherently achieved in the "overlay" device, through the use of the high conductivity base zone which also maintains current injection uniformity. However, prior art mesh emitter transistors do not employ a high conductivity base zone, and thus, are not as suitable for high-frequency operation as the "overlay" structure.

SUMMARY OF THE INVENTION

The present invention comprises a mesh emitter transistor formed in a crystalline semiconductor body with a major surface having a central portion. The device includes a collector region having a hub extending to the surface of the body, and including the central portion of the surface. An annular base region is disposed adjacent to the collector and around the hub, with portions of the base region extending to the surface and forming a plurality of radial lobes around the hub.

An emitter region is disposed within the base region, and comprises a ring around the ends of the base lobes, and wedge-shaped portions extending from the ring toward the hub and between adjacent lobes.

The device also includes means for making ohmic contact to the collector region, the base region, and the emitter region.

THE DRAWING

DETAILED DESCRIPTION

Figure 1:
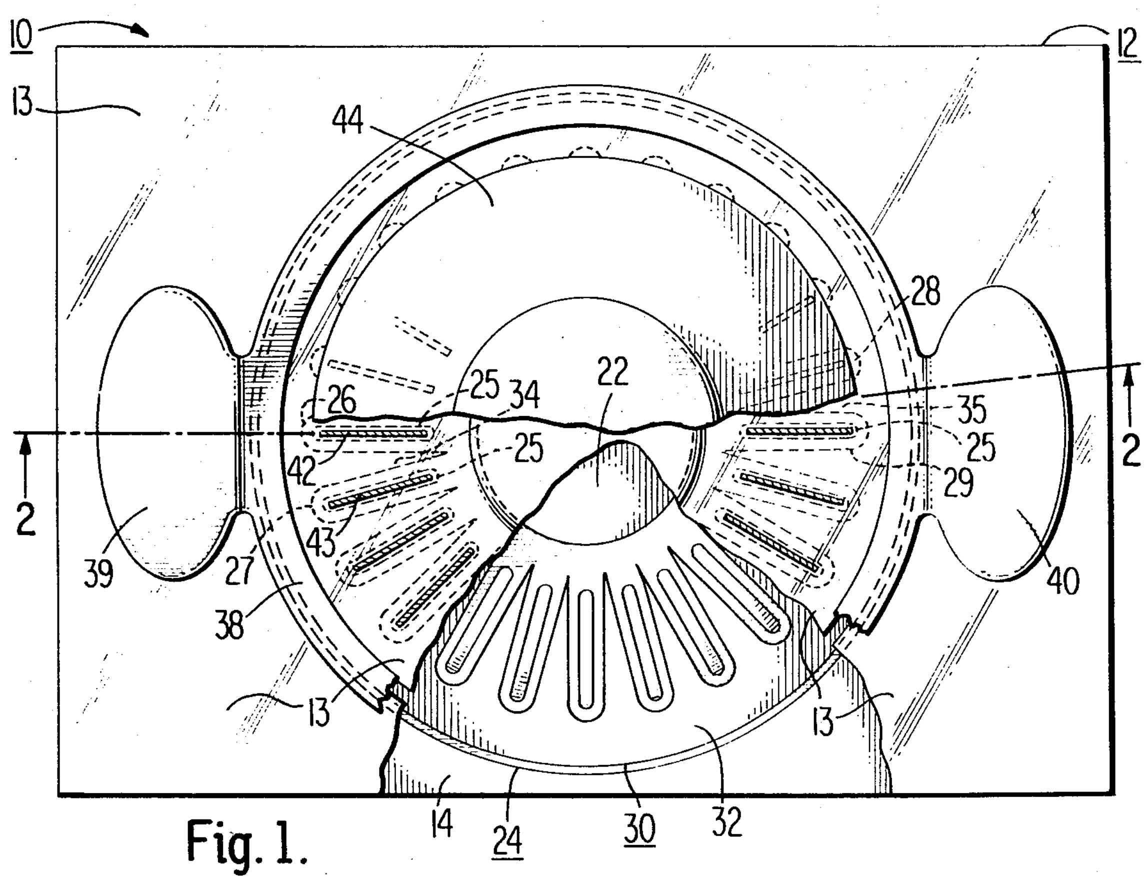
FIG. 1 is a top plan view of the preferred embodiment of the transistor, with portions of the device cut away.

A preferred embodiment of the high-frequency power transistor of the present invention will be described with reference to FIGS. 1 and 2.

The transistor includes a collector, a complex emitter and base geometry, and means for making ohmic contact to the semiconducting regions. As illustrated in FIGS. 1 and 2, the transistor 10 is formed in a crystalline semiconductor body 12 having a major surface 14, with an insulating coating 13 disposed over portions of the surface. While the size, shape, and composition of the body 12 is not critical, it preferably comprises a silicon wafer about 14.0 mils square, and 4.5 mils thick.

Figure 2:
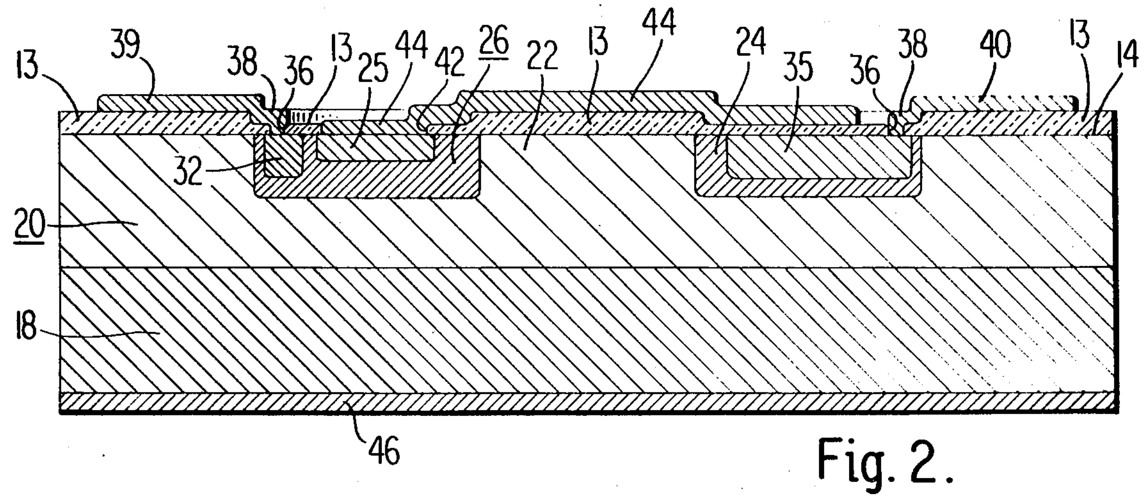
FIG. 2 is a cross-sectional view of the transistor of FIG. 1, taken along the line 2—2'.

As shown in FIG. 2, the transistor 10 includes a high conductivity N-type substrate strata 18 comprising the lower portion of the body 12, and a N-type collector region 20 adjacent the N+ substrate 18. The collector regions 20 has a hub 22 which extends to the top surface 14, and includes a central portion of the surface.

The transistor 10 includes an annular P-type base region 24 adjacent to the collector region 20 and around the hub 22. In FIG. 1, the outer concentric circle, a portion of which is dotted, represents the outer periphery of the annular base region 24. Portions of the base region 24 extend to the surface 14, and form a plurality of radial base lobes around the hub 22. Four of the base lobes are numbered 26–29 in FIGS. 1 and 2. The number of lobes employed is dependent upon the operating conditions of the device, as hereinafter described. In this embodiment, 24 lobes including base lobes 26–29, are employed. The diffusion depth of the base region 24 below the surface 14 is dependent upon the maximum frequency of operation contemplated. Suitably, the base region 24 is between 0.01 and 0.04 mils in depth for microwave operation. A shallow P+ base contact region 25 is disposed within each base lobe 26–29, in order to provide good ohmic base contact, and to minimize the base spreading resistance $R_{bb}'$.

The diffusion profile of the transistor 10 is completed with an N-type emitter region 30 disposed within the annular base region 24. In FIG. 1, the inner concentric circle, a portion of which is dotted, represents the outer periphery of the emitter region 30. The emitter region 30 comprises an emitter ring 32 encircling the outside ends of the base lobes, including lobes 26–29, and a plurality of wedge-shaped portions extending from the emitter ring 32 toward the hub 22 and between adjacent base lobes. In FIGS. 1 and 2, two of the emitter wedges are numbered 34 and 35; emitter wedge 34 is disposed between base lobes 26 and 27, and emitter wedge 35 is disposed between base lobes 28 and 29. Suitably, the emitter region 30 extends to a depth of between 0.005 and 0.035 mils below the surface 14.

The transistor 10 also includes means for making ohmic contact to the collector, to the base lobes, and to the emitter ring. Noting FIG. 2, the insulating coating 13 has an annular aperture 36 which exposes a portion of the emitter ring 32 at the surface 14. Emitter contact is provided by a high conductivity metal ring 38 which is disposed through the aperture 36 and onto a portion of the coating 13. A pair of emitter bond pads 39 and 40 are disposed over a portion of the coating 13 tangent to the metal ring 36 at opposing points on the ring. Suitably, the metal ring 38 and the bond pads 39 and 40 may comprise a layer of a highly conductive, nonrefractory metal such as aluminum, or a refractory metal, such as tungsten. The thickness of the emitter contact is not critical; by way of example, the ring 38 and the bond pads 39 and 40 may be between 0.02 and 0.12 mils thick.

The insulating coating 13 also has a plurality of slots, with each slot exposing a portion of a base lobe of the base region 24 at the surface 14. In FIGS. 1 and 2, two of the slots are numbered 42 and 43 and expose portions of base lobes 26 and 27, respectively, at the surface 14. A circular metal base contact layer 44 is disposed over the insulating coating 13 and through the slots, to provide ohmic contact to the annular base region 24 at each base lobe. Preferably, the base contact layer 44 extends only to the outer end of the slots, including slots 42 and 43. The base layer may also comprise aluminum or tungsten. Suitably, the layer 44 is also between 0.02 and 0.12 mils thick.

Ohmic contact to the collector region is provided by a metal layer 46 disposed on the lower surface of the N+ substrate 18.

The preferred embodiment of the transistor may be fabricated in the following manner. The starting semiconductor material preferably comprises a highly doped N-type silicon wafer, having a resistivity of about 0.015Ω·cm.[11]. The N-type collector region 20 is then epitaxially grown on the N+ wafer; suitably, the epitaxial layer is between 0.2 and 0.4 mils thick, and has a resistivity of 1.0 ohm-cm.[11]. The epitaxial growth method is well known in the art, and is not described herein.

A silicon dioxide insulating coating is then thermally grown over the top surface of the epitaxial layer. The surface is treated with a suitable photoresist, masked, exposed and developed, to leave unprotected an area of the oxide corresponding to the annular base region 24. The wafer is then treated with a suitable etchant to remove the unprotected oxide. Thereafter, the wafer is placed in a boron diffusion furnace and treated with boron nitride, so as to diffuse the annular base region into the epitaxial collector layer. The final diffusion depth depends on the desired range of frequency operation. During the base diffusion step, an oxide coating about 5,000 A. thick is grown over the exposed surface of the epitaxial layer and the remaining portions of the original oxide coating. The oxide is subjected to a second photoresist-mask-exposure-and-etch sequence, so as to remove those portions of the oxide corresponding to the base contact region 25. The shallow P+ base contact region 25 is then diffused into each base lobe. The oxide is then subjected to a third photoresist-mask-exposure-and-etch sequence so as to remove those portions of the oxide corresponding to the emitter ring 32 and the emitter wedges, including wedges 34 and 35. The wafer is then placed in a diffusion furnace and treated with a phosphorous solution so as to diffuse the emitter region 30 into the annular base region 24. The number of emitter wedges employed is dependent upon the desired power output and frequency of operation contemplated. For example, higher power requires that more emitter wedges be used.

Following the emitter diffusion, an additional oxide is deposited on the exposed portion of the surface of the epitaxial layer and the remaining oxide. A third photoresist-and-etch sequence opens the emitter aperture 36 and the base contacts slots, including slots 42 and 43. A layer of aluminum or tungsten is then deposited onto the entire surface of the oxide coating and the lower surface of the wafer, by any one of the methods well known in the art. A final photoresist-and-etch sequence removes the unwanted metal from the surface 14 and defines the emitter contact ring 38, the emitter bond pads 39 and 40, and the base contact layer 44. The device may then be disposed in a package, and lead wires bonded to the emitter bond pads 39 and 40, and the base contact layer 44.

Figure 3:
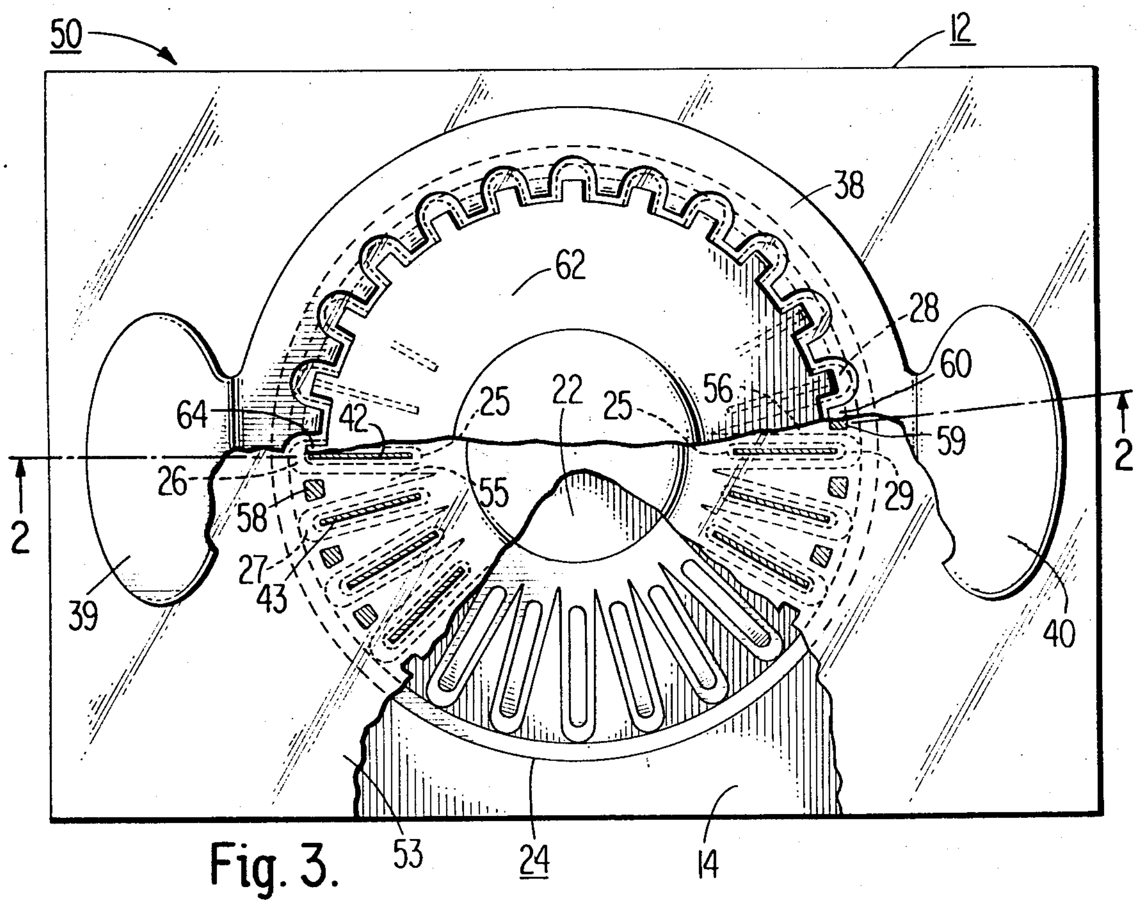
FIG. 3 is a top plan view of an alternate embodiment of the transistor, with portions of the device cut away.
Figure 4:
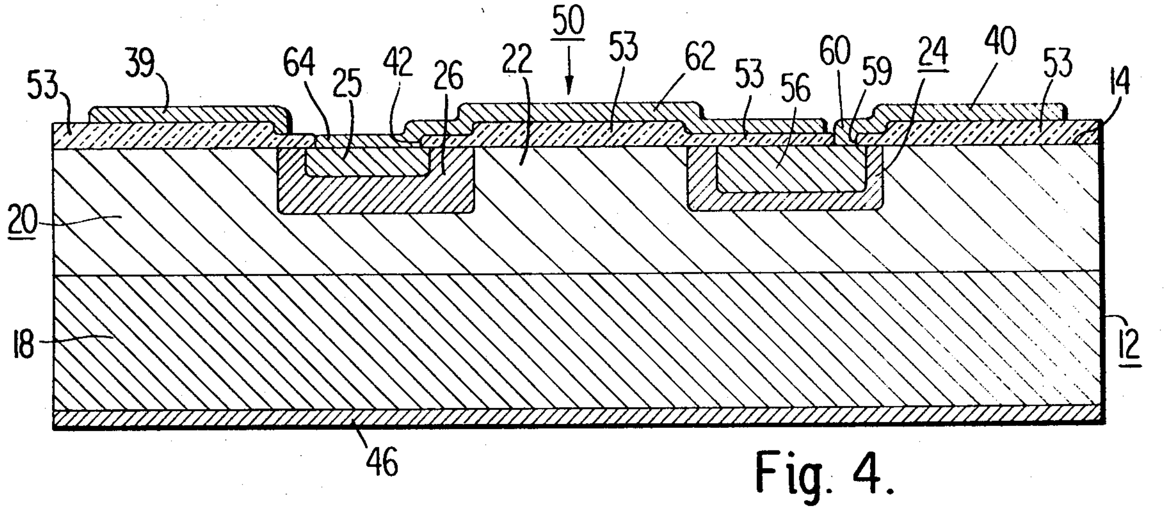
FIG. 4 is a cross-sectional view of the transistor of FIG. 3, taken along the line 4—4'.

A second embodiment of the transistor is shown in FIGS. 3 and 4. The transistor 50 is similar to the transistor 10 of FIGS. 1 and 2, except that the emitter ring 32 is omitted, and the base and emitter contact structures are modified to facilitate contact to the separate emitter wedges.

Noting FIGS. 3 and 4, the transistor 50 includes an N+ substrate 18, an N-collector region 20 having a hub 22 extending to the surface 14, and an annular base region 24, with portions of the base extending to the surface and forming a plurality of radial lobes around the hub. Four of the base lobes are numbered 26–29 in FIGS. 3 and 4.

The transistor 50 includes an emitter region which comprises a plurality of separate N-type wedges disposed in the annular base 24 between adjacent base lobes. Two of the emitter wedges are numbered 55 and 56 in FIGS. 3 and 4, and are disposed between base lobes 26–27 and 28–29, respectively.

An insulating coating 53 of silicon dioxide is disposed over portions of the surface 14. The coating 53 has a plurality of base contact slots, with each slot exposing a portion of a base lobe at the surface 14. In FIGS. 3 and 4, two slots are numbered 42 and 43, and expose portions of lobes 26 and 27, respectively. The coating 53 also has a plurality of emitter contact apertures with each aperture exposing portions of each emitter wedge at the surface 14. In the drawing, two of the emitter apertures are numbered 58 and 59, and expose portions of emitter wedges 55 and 56, respectively.

Ohmic contact is made to the emitter wedges in a manner similar to that described above in the preferred embodiment, except that a plurality of metal "tabs" extend from the metal contact ring 38 and over the coating 53 to make contact to the emitter wedges through the corresponding emitter aperture. In FIGS. 3 and 4, one tab, numbered 60, makes contact to emitter wedge 56 through emitter aperture 59. Ohmic base contact is also similar to the preferred embodiment, except that the circular base contact layer 62 of the transistor 50 includes a plurality of base contact tabs with each tab extending to the end of the corresponding base slot. One of the base contact tabs is numbered 64 in FIGS. 3 and 4.

Alternatively, a contact structure identical to that disclosed with reference to transistor 10 may be employed with the transistor 50, by reducing the length of the base slots in the oxide coating.

A high-frequency power transistor constructed in accordance with the present invention provides many advantages not heretofore known in prior art mesh emitter devices.

First, the radial design of the device provides better temperature distribution, since those segments of the emitter which inject the most current are located around the periphery of the device.

Second, the wedge-shaped emitter region portions provide a high degree of current injection uniformity along the emitter-base junction. Further, the emitter-base geometry of the device is highly flexible, in that a more narrow emitter wedge may be used, permitting an increased ratio of emitter periphery to base area, which determines the maximum frequency and power gain characteristics of the transistor.

Third, locating the base contact layer in the center of device permits the base lead wire to directly overlie the base contacts. This results in very low base lead inductance, making the design ideal for a common base transistor. Further, locating the base contact layer in the center of the device aids to reduce the temperature at the center, which, by thermal (infrared) plotting, exhibits the highest temperature in RF power transistors.

Further advantages accrued by employing other techniques well known to those skilled in the design of high-frequency power transistors. For example, the device is compatible with existing "flip-chip" technology, or may be used in a multicelled structure. The shallow P+ diffusion through the base contact slots allows the emitter wedges to be spaced closer together to increase the emitter periphery-base area ratio. Further, while an NPN device has been described, a PNP complementary device is within the ambit of the present design.

I claim:

1. A semiconductor device comprising:

a crystalline semiconductor body with a major surface having a central portion thereon;

a collector region within the body having a hub extending to the surface and including the central portion;

an annular base region disposed adjacent the collector region and around the hub, portions of the base region extending to the surface and forming a plurality of radial lobes around the hub, each lobe having a shallow, high conductivity region therein of the same conductivity type;

an emitter region comprising a ring encircling the ends of the base lobes, and wedge-shaped portions extending from the ring toward the hub and between adjacent base lobes;

an insulating coating on the surface having an aperture exposing the emitter ring, said coating also having a plurality of slots, with each slot exposing one of said base lobes;

a metal emitter contact layer making ohmic contact only to the emitter ring; and a circular base metal layer of uniform radius disposed on the coating and extending to the ends of said lobes, said base layer contacting each shallow, high conductivity region of all of said lobes through the slots.